(12) United States Patent
Park et al.

(10) Patent No.: US 12,310,243 B2
(45) Date of Patent: May 20, 2025

(54) PIEZOELECTRIC STRUCTURE, METHOD FOR MANUFACTURING THEREOF AND HIGH SENSITIVE PRESSURE SENSOR USING THE SAME

(71) Applicant: UNIVERSITY-INDUSTRY FOUNDATION(UIF), YONSEI UNIVERSITY, Seoul (KR)

(72) Inventors: Hyung Ho Park, Seoul (KR); Kyung Mun Kang, Seoul (KR); Yue Wang, Seoul (KR); Min Jae Kim, Yongin-si (KR); Chabungbam Akendra Singh, Seoul (KR); Chan Lee, Seoul (KR)

(73) Assignee: UNIVERSITY-INDUSTRY FOUNDATION(UIF), YONSEI UNIVERSITY, Seoul (KR)

( * ) Notice: Subject to any disclaimer, the term of this patent is extended or adjusted under 35 U.S.C. 154(b) by 583 days.

(21) Appl. No.: 16/951,006

(22) Filed: Nov. 18, 2020

(65) Prior Publication Data

US 2021/0202826 A1    Jul. 1, 2021

(30) Foreign Application Priority Data

Dec. 26, 2019  (KR) .................. 10-2019-0175418

(51) Int. Cl.
*H01L 41/187* (2006.01)
*H01L 41/113* (2006.01)
(Continued)

(52) U.S. Cl.
CPC ......... *H10N 30/8536* (2023.02); *H10N 30/05* (2023.02); *H10N 30/302* (2023.02)

(58) Field of Classification Search
CPC . H01L 41/27; H01L 41/1132; H01L 41/1871; H10N 30/05; H10N 30/302; H10N 30/8536
(Continued)

(56) References Cited

U.S. PATENT DOCUMENTS

| 2004/0150043 | A1* | 8/2004 | Holm | .................. | H01L 21/8258 257/E27.012 |
| 2020/0169192 | A1* | 5/2020 | Matsuda | ................ | H02N 2/106 |
| 2020/0227621 | A1* | 7/2020 | Morishita | ............... | C04B 35/26 |

FOREIGN PATENT DOCUMENTS

KR  10-2096-0707597    8/1997
KR  10-2005-0106391    11/2005
(Continued)

OTHER PUBLICATIONS

Korean Office Action for Application No. KR 10-2019-0175418 issued on Jul. 8, 2021.

*Primary Examiner* — Emily P Pham
*Assistant Examiner* — Monica Mata
(74) *Attorney, Agent, or Firm* — NSIP Law

(57) ABSTRACT

The present invention relates to a piezoelectric structure, a method of fabricating the same, and a pressure sensor using the same. A piezoelectric structure comprises perovskite structure layers including a material having an $ABO_3$ perovskite structure and an interlayer including a metal oxide A*O interposed between the perovskite structure layers. A or A* is one of an alkaline earth metal element, an alkali metal element, a lanthanum group element, and a post-transition metal element, B is a transition metal element, and O is an oxygen element.

11 Claims, 4 Drawing Sheets

(51) Int. Cl.
    *H01L 41/27*      (2013.01)
    *H10N 30/05*      (2023.01)
    *H10N 30/30*      (2023.01)
    *H10N 30/853*     (2023.01)
(58) Field of Classification Search
    USPC .......................................................... 310/338
    See application file for complete search history.

(56)              References Cited

FOREIGN PATENT DOCUMENTS

KR   10-2017-0003401      1/2017
KR   10-2019-0119203     10/2019

* cited by examiner

PIEZOELECTRIC STRUCTURE, METHOD FOR MANUFACTURING THEREOF AND HIGH SENSITIVE PRESSURE SENSOR USING THE SAME

CROSS-REFERENCES TO RELATED APPLICATION

The present application claims the benefit of Korean application number 10-2019-0175418, filed on Dec. 26, 2019, which is herein incorporated by reference in its entirety.

BACKGROUND OF THE INVENTION

1. Field

The present invention relates to a new material technology, and more particularly, to a piezoelectric structure, a method of fabricating the same, and a high sensitivity pressure sensor using the same.

2. Description of the Related Art

In general, a piezoelectric pressure sensor using a piezoelectric material may be operated based on a piezoelectric effect that an electric signal is generated by structural changes of the piezoelectric material due to an external pressure on the piezoelectric material. The external pressure applied to the piezoelectric material may induce a structural distortion of the material, resulting in an asymmetry of the structure to induce a band bending phenomenon of the piezoelectric material and therefore generate a piezoelectric-field in the piezoelectric material. As the piezoelectric field generated by the pressure may be output as an electric signal (e.g., current or voltage), it may be sensed or detected. The piezoelectric pressure sensor requires a complex structure having upper and lower electrodes, a circuit and an electrical signal detector, and a high driving pressure of a level of GPa or MPa. In order to meet the requirements of a next-generation pressure sensor, the structure of the pressure sensor should be simplified, and the sensitivity of the pressure sensor should be enhanced enough to detect a small pressure change. In this view, the next-generation pressure sensor may be implemented with a new and different material and design.

Recently, a piezoluminescence sensor using a unique color luminescence phenomenon induced by an external pressure or a color intensity change induced by a pressure change is being developed by using perovskite materials such as $CsPbBr_3$, $(MA)PbBr_3Cl_3I_3$(MA: methylammonium), $(FA)PbBr_3$(FA: formamidinium). In these materials, it is possible to vary colors of the materials according to the variation of the pressure, but in order to use perovskite materials into a sensor, it is necessary to apply a large pressure of several GPa or more. For example, for the sensor, a pressure of about 1 to 40 GPa may be required depending on the perovskite materials. In addition, since a wavelength change range in the color luminescence phenomenon is only within 100 nm, there is no significant difference in color, and thus, it may be difficult to utilize the perovskite as a sensor that measures pressure by detecting color change of the materials. The pressure value of several GPa is too large to be used as a sensor for everyday life, and the change in wavelength causing color change is insignificant, the application of the conventional perovskite material as the pressure sensor may be limited.

In order to improve the sensitivity of a pressure sensor, it is necessary to enhance a piezoluminescence performance in which a remarkable color change is generated even at a low pressure.

SUMMARY OF THE INVENTION

Accordingly, the technological problem to be solved by the present invention is to provide a piezoelectric structure having a high sensitivity and high efficiency in which a wider wavelength change in a piezoluminescence is obtained notwithstanding a low driving pressure.

In addition, another technological problem to be solved by the present invention is to provide a method of fabricating a piezoelectric structure having the above-described advantages.

In addition, another technological problem to be solved by the present invention is to provide a high sensitivity pressure sensor having the above-described advantages.

According to an embodiment of the present invention, a piezoelectric structure comprising perovskite structure layers including a material having an $ABO_3$ perovskite structure and an interlayer including a metal oxide AO interposed between the perovskite structure layers, wherein A is one of an alkaline earth metal element, an alkali metal element, a lanthanum group element, and a post-transition metal element, B is a transition metal element, and O is an oxygen element may be provided. The perovskite structure layer and the interlayer may be alternately stacked two or more times. The material having the $ABO_3$ perovskite structure may include any one of $BaTiO_3$, $SrTiO_3$, $CaTiO_3$, $PbTiO_3$, $LaTiO_3$, $PbZrO_3$ and $LiNbO_3$. The interlayer may generate lattice defects by inducing a structural change in the local strain of the piezoelectric structure. The metal oxide is an alkaline earth metal oxide, and the alkaline earth metal oxide may include any one of MgO, CaO, SrO, BaO, BeO, and RaO.

In one embodiment, at least one of the perovskite structure layer and the interlayer may include a dopant, the dopant may include a rare earth element or a transition metal element, the rare earth element may include any one of Sm, Eu, Gd, Yb, Pr, Tm and Er, and the transition metal may include at least one of Mn, Cu, Nb, and Co. The light emission intensity and a driving pressure of the piezoelectric structure may be controlled according to the number of interlayers. The light emission color and a light emission intensity of the piezoelectric structure may be controlled by a trap site formed in the perovskite structure layers.

The piezoelectric structure is a piezoelectric structure including a compound of the following formula.

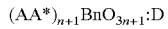

$$(AA^*)_{n+1}BnO_{3n+1}:D$$

Here, A and A* are any one of an alkaline earth metal element, an alkaline metal element, a lanthanum group element, and a post-transition metal element, B is a transition metal element, O is an oxygen element, D is a dopant, and n is an integer.

According to another embodiment of the present invention, a method for manufacturing a piezoelectric structure comprising a step for forming a perovskite structure layer including a material having an $ABO_3$ perovskite structure; and a step for forming an interlayer including a metal oxide (A*O) on the perovskite structure layer, and wherein the step for forming the perovskite structure layer, and the step for forming the interlayer are repeatedly performed may be provided, so that the interlayer may be inserted between the perovskite structure layers. Here, A and A* are any one of an alkaline earth metal element, an alkaline metal element, a lanthanum group element, and a post-transition metal element, B is a transition metal element, and O is an oxygen element. The step for forming the perovskite structure layer, and the step for forming the interlayer may be performed by a Physical vapor deposition (PVD), a chemical vapor deposition (CVD), or an atomic layer deposition (ALD). The step for forming a dopant in the perovskite structure layer or the interlayer may be further included.

According to still another embodiment of the present invention, a piezoelectric-light-emission sensor using the above-described piezoelectric structure may be provided.

According to another embodiment of the present invention, a display device using the above-described piezoelectric structure may be provided.

According to an embodiment of the present invention, since a piezoelectric structure comprising perovskite structure layers including a material having an $ABO_3$ perovskite structure; and an interlayer including a metal oxide AO interposed between the perovskite structure layers is used, there is an advantage that a large change in the wavelength of the output light is obtained in response to a low driving pressure, and a measurement with high sensitivity and high efficiency may be implemented.

In addition, according to another embodiment of the present invention, a method of fabricating a piezoelectric structure having the above-described advantages may be provided.

Further, according to another embodiment of the present invention, a pressure sensor having the above-described advantages may be provided.

In addition, according to another embodiment of the present invention, a display device having the above-described advantages may be provided.

DETAILED DESCRIPTION OF THE INVENTION

Figure 1A:
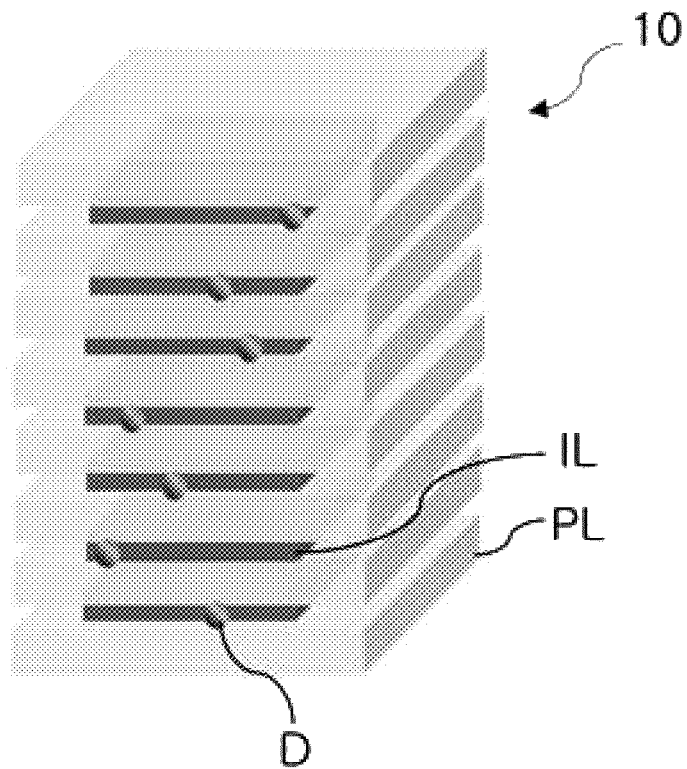
FIG. 1A and FIG. 1B are perspective views of a piezoelectric structure according to an embodiment of the present invention.

Hereinafter, the preferred embodiments of the present invention will be described in detail with reference to the accompanying drawings.

The embodiments of the present invention are provided to more fully describe the present invention to those having a common knowledge in the related art, and the following embodiments may be modified in various other forms, and the scope of the present invention is not limited to the following embodiments. Rather, these embodiments are provided to explain the present invention more clearly and complete, and to fully convey the spirit of the present invention to those skilled in the art.

The same reference numerals in the drawings refer to the same elements. Further, as used herein, the term, "and/or" includes any one and all combinations of one or more of the listed items.

The terminology used herein is used to describe a specific embodiment and is not intended to limit the present invention. As used herein, a singular form may include plural forms unless the context clearly indicates otherwise. Also, as used herein, the term such as "comprise" and/or "comprising" specifies the mentioned shapes, numbers, steps, actions, members, elements and/or the presence of these groups, and does not exclude the presence or addition of one or more other shapes, numbers, actions, members, elements and/or presence or addition of groups.

Reference to a layer formed "on" a substrate or other layer herein refers to a layer formed directly on the substrate or other layer; or also may refer to an interlayer formed on the substrate or other layer, or a layer formed on interlayers. Further, for those skilled in the art, a structure or shape arranged "adjacent" to another shape may have a portion disposed below or overlapping the adjacent shape.

In this specification, as shown on the drawings, the relative terms such as "below", "above", "upper", "lower", "horizontal" or "vertical" may be used to describe the relationship between one component member, one layer, or one region and another component member, another layer, or another region. It is to be understood that these terms encompass not only the orientation indicated in the figures, but also other orientations of the device.

Hereinafter, the embodiments of the present invention will be described with reference to the drawings schematically showing ideal embodiments (and interlayer structures) of the present invention. In the drawings, for example, the size and shape of the members may be exaggerated for convenience and clarity of description, and in actual implementation, modifications of the illustrated shape may be expected. Accordingly, embodiments of the present invention should not be construed as limited to the specific shapes of the members or regions shown herein. In addition, reference numerals of members in the drawings refer to the same members throughout the drawings.

Figure 1B:
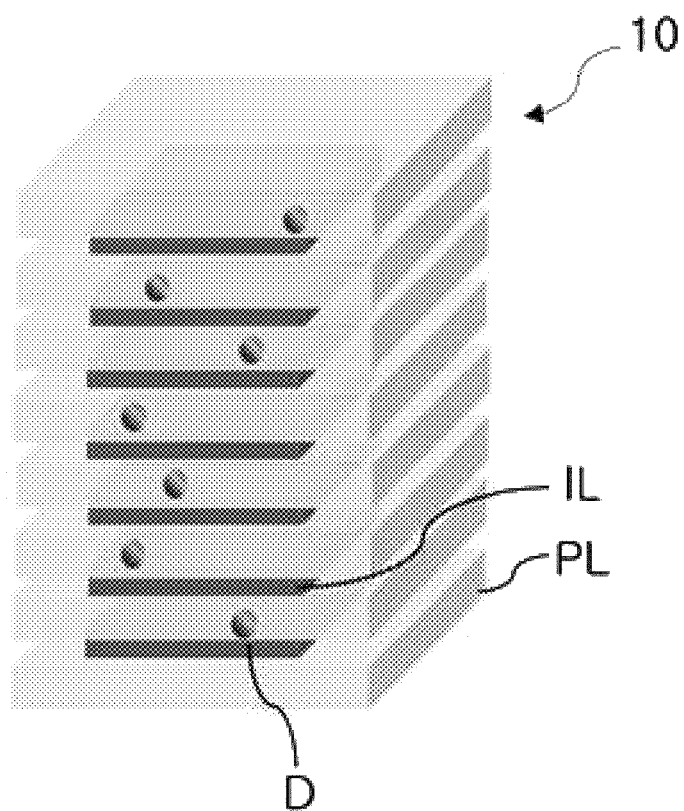

FIG. 1A and FIG. 1B are perspective views of a piezoelectric structure according to an embodiment of the present invention Referring to FIG. 1A and FIG. 1B, the piezoelectric structure 10 may include perovskite structure layers PL including a material having an $ABO_3$ perovskite structure, and an interlayer IL including an intercalated metal oxide (A*O). formed between perovskite structure layers PL. A or A* is one of an alkaline earth metal element, an alkaline metal element, a lanthanum group element, and a post-transition metal element, B is a transition metal element, and O is an oxygen element. Preferably, A and A* may be the same or different alkaline earth metal elements.

Electrodes may be disposed at the top and bottom of the piezoelectric structure. The electrodes may be well-known transparent conductor, for example Ag mesh, graphene and indium tin oxide (ITO).

The material having the $ABO_3$ perovskite structure may include any one of $BaTiO_3$, $SrTiO_3$, $CaTiO_3$, $PbTiO_3$, $LaTiO_3$, $PbZrO_3$ and $LiNbO_3$. However, the present invention is not limited to these materials. Preferably, the material having the $ABO_3$ perovskite structure may be at least one of $BaTiO_3$, $SrTiO_3$ and $CaTiO_3$.

In an example, the perovskite structure layers PL may be materials having the same ABO₃ perovskite structure or materials having different ABO₃ perovskite structures may be alternately disposed.

The metal oxide (A*O) constituting the interlayer IL may be an alkaline earth metal oxide. The alkaline earth metal oxide may include any one of MgO, CaO, SrO, BaO, BeO and RaO. However, the present invention is not limited to these materials. Preferably, the alkaline earth metal oxide may be at least one of MgO, CaO, SrO, and BaO. In an example, like the perovskite structure layers PL, the interlayer IL may be the same alkaline earth metal oxides or different alkaline earth metal oxides may be alternately disposed as the interlayer IL.

The interlayer IL may have a thickness ranging from 1 Å to 10 Å. At less than 1 Å, it is difficult to create a grating layer, and thus, it is impossible to control the critical operating pressure of the pressure structure. At more than 10 Å, the formation of a piezoelectric-field of the pressure structure may be insignificant, and thus, it may be difficult to realize low-pressure light emission.

In one embodiment, the perovskite structure layer PL and the interlayer IL may be alternately stacked two or more times. Preferably, in order to use the pressure structure 10 as a pressure light emitting device or a display device, the perovskite structure layer PL and the interlayer IL may be alternately stacked 1 to 10,000 times or more.

According to the examples, the piezoelectric field may be increased by enhancing or maximizing the local piezo-potential through the inconsistency of the crystal structure induced through the insertion of the interlayer IL between the perovskite structure layers PL, and accordingly, a wide wavelength change may be induced.

In an embodiment of the present invention, the light emission intensity and a driving pressure of the piezoelectric structure 10 may be controlled by the number and thickness of the interlayer IL. For example, as the number of the interlayer (IL) increases, the number of the interface between the interlayer (IL) and the perovskite structure layer PL increases, the number of lattice defects which act as traps of electrons and holes in piezoelectric emission increases through the lattice mismatch at the interfaces, resulting in increasing the local piezoelectric potential so that light emission may occur at a low pressure.

In an embodiment, optionally, the perovskite structure layer PL or the interlayer IL may include at least one dopant D.

Referring to FIG. 1A, at least one or more dopant D may be included in each interlayer IL, and referring to FIG. 1B, at least one or more dopant D may be included in each perovskite structure layer PL. The dopant D may include a rare earth element, a transition metal element, or a combination thereof. For example, the rare earth element may include at least one of samarium Sm, europium Eu, gadolinium Gd, ytterbium Yb, praseodymium Pr, thulium Tm, and erbium Er, and the transition metal may include manganese Mn, copper Cu, niobium Nb, and cobalt Co. However, the present invention is not limited to these elements.

As a trap site may be formed in the perovskite structure layer PL with the addition of the dopant D, a band gap in which light emission occurs may be adjusted. This means that the color and intensity of the light emission of the piezoelectric structure 10 may be controlled by the trap site formed in the perovskite structure layer PL.

Figure 2A:
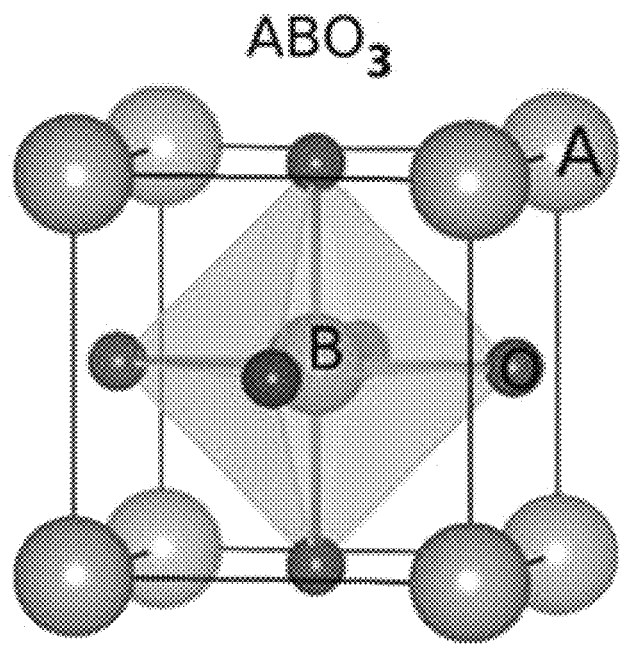
FIG. 2A is a view showing an $ABO_3$ perovskite structure according to an embodiment of the present invention.
Figure 2B:
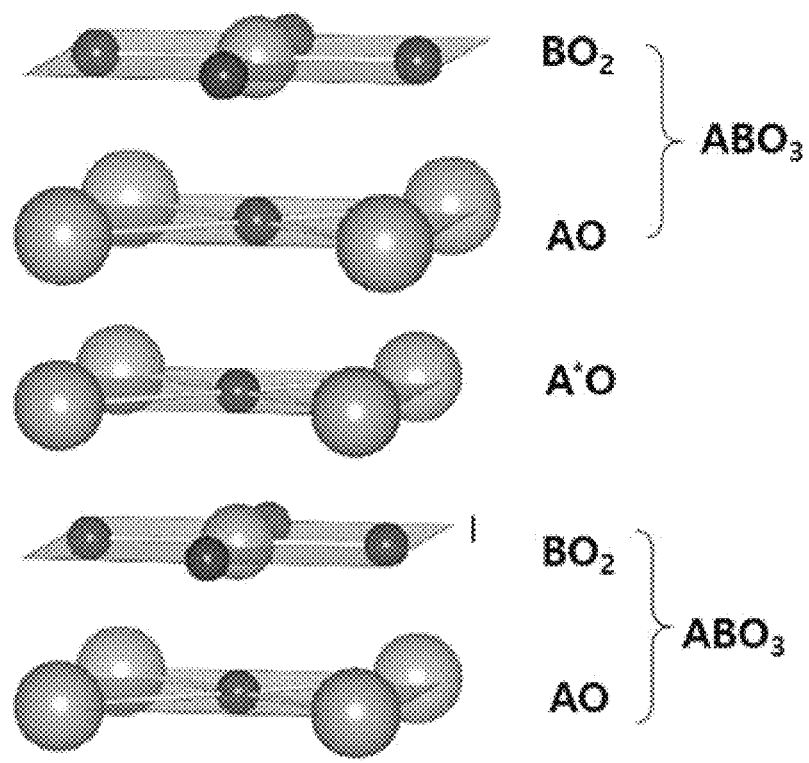
FIG. 2B is a diagram showing the three-dimensional structure of an interlayer between $ABO_3$ perovskite structure layers constituting a piezoelectric structure, and the perovskite structure layers.

FIG. 2A is a view showing an ABO₃ perovskite structure according to an embodiment of the present invention, and FIG. 2B is a diagram showing the three-dimensional structure of an interlayer between ABO₃ perovskite structure layers constituting a piezoelectric structure, and the perovskite structure layers.

Referring to FIG. 2A, the ABO₃ perovskite structure may have a simple cubic structure, and in connection with the unit cell level of the ABO₃ perovskite structure, eight A ions may be filled at the corners of the unit cell in which one B ion is disposed at a body core, and 6 oxygen O ions are centered at each face. Here, the ABO₃ perovskite structure layer PL may be composed of an AO layer and a BO₂ layer in FIG. 2B.

Referring to FIG. 2B, there are two adjacent ABO₃ perovskite structure layers. An interlayer IL including A*O may be formed or arranged between a first ABO₃ perovskite structure layer PL and a second ABO₃ perovskite structure layer PL by method of manufacturing a piezoelectric structure to be described later. The AO layer of the ABO₃ perovskite structure layer PL and A*O layer of the interlayer IL may have the same crystal structure with each other. In FIG. 2B, one interlayer IL is inserted therebetween as an example, but the number or thickness of the interlayer IL may be determined in consideration of driving voltage and emission wavelength required for the piezoelectric structure 10.

The piezoelectric structure 10 may be generalized as shown in the following Chemical Formula 1.

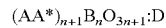

$$(AA^*)_{n+1}B_nO_{3n+1}:D \quad \text{[Formula 1]}$$

Here, A and A* are one of alkaline earth metal element, alkaline metal element, lanthanum group element, and post-transition metal element, wherein A and A* are the same with each other or different from each other, B is a transition metal element, O is an oxygen element, D is a dopant, and n is an integer in the range of 1 to 10,000.

In the operation of the piezoelectric structure 10, a piezoelectric-field may be generated due to asymmetric structural change in the ABO₃ perovskite structure induced by an external pressure, and then piezoelectric-field may incur bending the energy band of the ABO₃ perovskite structure, resulting that electrons in the electron trap move to the conduction band. Then, a release of non-radioactive energy by electron-hole recombination may occur the ABO₃ perovskite structure.

As described above, in the present invention, $(AA^*)_{n+1}B_nO_{3n+1}$ structure may be formed by inserting a metal oxide(A*O layer) as an interlayer IL between the ABO₃ perovskite structure layers PL, and therefore, it is possible to induce local changes in the ABO₃ perovskite structure layers PL due to the difference in atomic size. Such a structural change causes crystal structural distortion, and the number of lattice defects may increase through the induced structural distortion. These defects becomes an important factor in increasing the pressure constant (piezo-constant) by acting as a trap for electrons and holes in piezoelectric light emission. In addition, it is possible to control the intensity of light emission and a critical operating pressure by adjusting the ratio of the inserted A*O interlayer and the perovskite structure layer PL in the number or thickness thereof.

In addition, a trap site in the ABO₃ perovskite structure layer PL may be formed by using rare earth elements such as $Pr^{3+}$, $Tm^{3+}$, $Er^{3+}$ as a dopant, and a band-gap in which light emission occurs may be adjusted. Through this adjustment, it may be used as an efficient piezoelectric light emitting device (sensor or display) having color variability by adjusting the light emission color and light emission intensity.

By inserting an interlayer and adding a dopant, it is possible to provide a device with high sensitivity and high efficiency over the conventional devices. In addition, according to the present invention, the device may have a low driving voltage and may induce a change in emission wavelength.

Figure 3A:
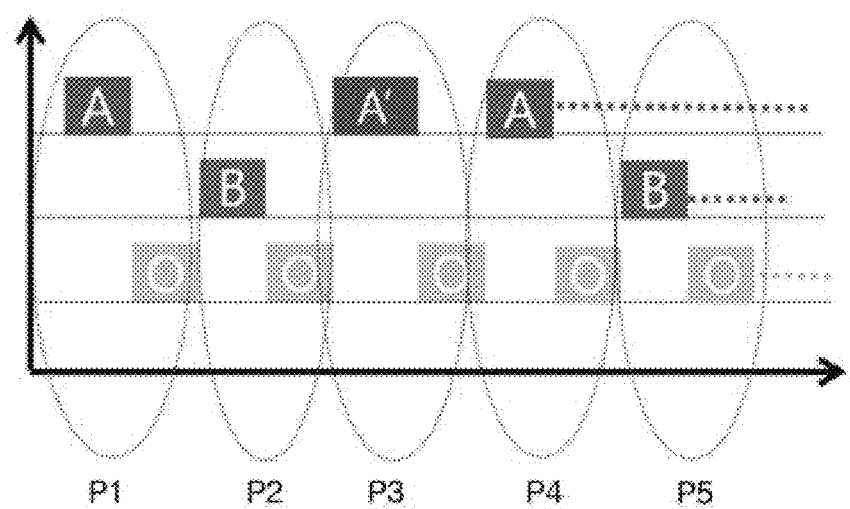
FIG. 3A and FIG.
Figure 3B:
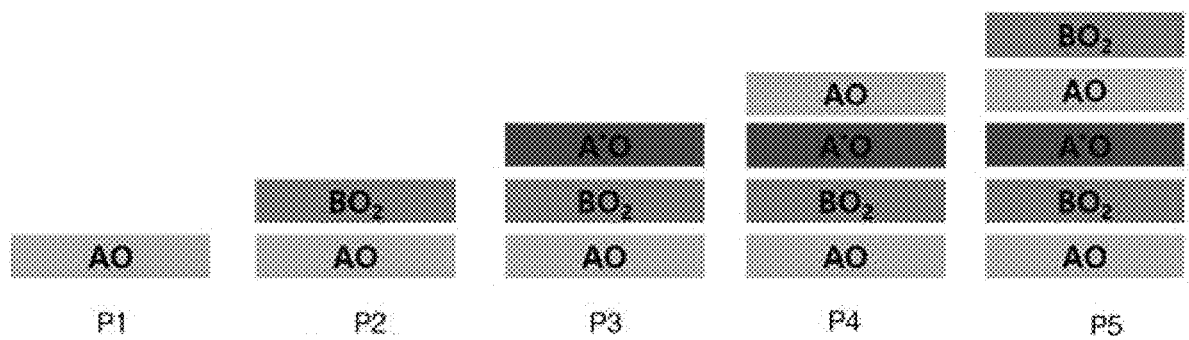
FIG. 3B are diagrams for explaining a method for manufacturing a piezoelectric structure according to an embodiment of the present invention.

FIG. 3A and FIG. 3B are diagrams for explaining method of fabricating a piezoelectric structure according to an embodiment of the present invention.

Referring to FIGS. 3A and 3B, the present invention comprises a step for forming a perovskite structure layer including a material having an $ABO_3$ perovskite structure; and a step for forming an interlayer including a metal oxide (A*O) on the perovskite structure layer. Further, the step for forming the perovskite structure layer and the step for forming the interlayer are repeatedly performed, so that the interlayer may be inserted between the perovskite structure layers. A and A* are any one of an alkaline earth metal element, an alkaline metal element, a lanthanum group element, and a post-transition metal element, B is a transition metal element, and O is an oxygen element.

In one embodiment, the source containing the element A or A*, and the source containing the element B, and the source containing oxygen O may be supplied by a predefined sequence. For example, A element—O element—B element—O element—A* element—A element—O element—B element—O element may be orderly supplied according to the sequence of the above description. In the method, a purge process may be interposed between the two adjacent steps of supplying each element.

In one embodiment, a step for forming a perovskite structure layer comprising a material having an $ABO_3$ perovskite structure may include a step for forming an AO layer in a P1 process and forming a $BO_2$ layer on the AO layer in a P2 process. The AO layer is formed by supplying the A element and the O element in the P1 process, and the $BO_2$ layer is formed by supplying the B element and the O element in the P2 process, so that the first $ABO_3$ perovskite structure layer may be formed. The step for forming an interlayer including a metal oxide (A*O) on the perovskite structure layer may form A*O layer on the perovskite structure layer by providing the A* element and the O element are supplied in the P3 process. The P4 process and the P5 process are the same processes as the P1 and P2 processes, and a second $ABO_3$ perovskite structure layer may be formed on the A*O layer formed in the P3 process.

The step for forming the perovskite structure layer and the step for forming the interlayer may be performed by a physical vapor deposition (PVD), a chemical vapor deposition (CVD), an atomic layer deposition (ALD), a molecular beam epitaxy (Molecular Beam Epitaxy: MBE) or a Pulsed Laser Deposition (PLD). Preferably, the steps for forming the perovskite structure layer and the interlayer may be performed by any one of the ALD, MBE, or PLD.

The material having the $ABO_3$ perovskite structure may include any one of $BaTiO_3$, $SrTiO_3$, $CaTiO_3$, $PbTiO_3$, $LaTiO_3$, $PbZrO_3$ and $LiNbO_3$. However, the present invention is not limited to these materials. Preferably, the material having the $ABO_3$ perovskite structure may be at least one of $BaTiO_3$, $SrTiO_3$ and $CaTiO_3$. The metal oxide constituting the interlayer may be an alkaline earth metal oxide. The alkaline earth metal oxide may include any one of MgO, CaO, SrO, BaO, BeO and RaO. However, the present invention is not limited to these materials. Preferably, the alkaline earth metal oxide may be at least one of MgO, CaO, SrO, and BaO.

In an embodiment of the present invention, optionally, a step for forming a dopant in the perovskite structure layer or the interlayer may be further performed. Although not shown, when the dopant is added into the perovskite structure layer, the step for forming the dopant may be performed between the P1 process and the P2 process or between the P2 process and the P3 process. When the dopant is added to the interlayer, the step for forming the dopant may be performed between processes P3 and P4.

The dopant D may include a rare earth element or a transition metal element. For example, the rare earth element may include at least any one of samarium Sm, europium Eu, gadolinium Gd, ytterbium Yb, praseodymium Pr, thulium Tm, and erbium Er. The transition metal may contain manganese Mn. However, the present invention is not limited to these elements.

Figure 4:
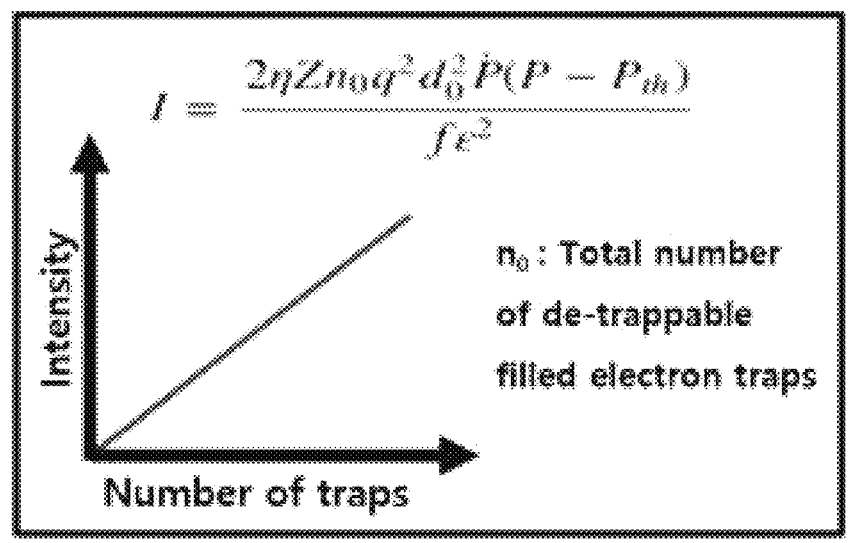
FIG. 4 is a graph showing emission intensity according to the number of traps according to an embodiment of the present invention.

FIG. 4 is a graph showing emission intensity according to the number of traps according to an embodiment of the present invention.

Referring to FIG. 4, as the number of electron traps increases, the probability of electron-hole recombination increases, and thus, the emission intensity or emission strength may increase proportionally to the number of electron traps. The number of electron traps may be affected by lattice defects induced by an interlayer inserted between the adjacent $ABO_3$ perovskite structure layers.

As described above, since the piezoluminescence device may be operated without an external driving voltage unlike the conventional light emitting device, the piezoluminescence device may replace a display that requires a battery, and may be applied to devices of micro and nano size. In addition, it is also suitable for flexible device application. Piezoluminescence displays with these adjustable emission wavelengths may replace solid state lighting SSL in a variety of modern applications, such as artificial skin and self-driving display systems. Further, the pressure light emitting device may be used as an energy storage material capable of storing light energy, and emitting light by mechanical stimulation.

In an embodiment of the present invention, since a piezo-electric field inside a material induced by a stress may be amplified by inducing a local structural defect by inserting an inter-layer, the piezo-potential may maximized and may be used in real life at a low driving voltage. In addition, by controlling the emission wavelength and intensity through doping of rare earth elements, the piezoluminescence device may be applied to a highly sensitive device.

Although many items are specifically described in the above description, they should be interpreted as examples of specific embodiments rather than limiting the scope of the invention, and various modifications may be made. Therefore, the scope of the present invention should not be determined by the described embodiments, but should be determined by the technological idea described in the claims.

What is claimed is:

1. A piezoelectric structure comprising,
   perovskite structure layers comprising a material having an $ABO_3$ perovskite structure; and an interlayer comprising a metal oxide AO interposed between the perovskite structure layers,
   wherein A is one of an alkaline earth metal element, an alkali metal element, a lanthanum group element, and a post-transition metal element, B is a transition metal element, and O is an oxygen element,
   wherein the interlayer is configured to generate lattice defects by inducing a local strain in the piezoelectric structure, and the interlayer is configured to increase a local piezo-potential of the piezoelectric structure, and wherein the material having the $ABO_3$ perovskite structure is selected from the group consisting of $CaTiO_3$, $PbTiO_3$, $LaTiO_3$, $PbZrO_3$, and $LiNbO_3$, and wherein the metal oxide AO is an alkaline earth metal oxide selected from the group consisting of CaO, SrO, BeO, and RaO.

2. The piezoelectric structure of claim 1, wherein the perovskite structure layers and the interlayer are alternately stacked two or more times.

3. The piezoelectric structure of claim 1, wherein at least one of the perovskite structure layers and the interlayer comprises a dopant, the dopant comprises a rare earth element or a transition metal element, the rare earth element is selected from the group consisting of Sm, Eu, Gd, Yb, Pr, Tm and Er, and the transition metal element is selected from the group consisting of Mn, Cu, Nb, and Co.

4. The piezoelectric structure of claim 1, wherein a light emission intensity and a driving pressure of the piezoelectric structure is controlled according to a number of interlayers.

5. The piezoelectric structure of claim 1, wherein a light emission color and a light emission intensity of the piezoelectric structure is controlled by a trap site formed in the perovskite structure layers.

6. The piezoelectric structure of claim 1, comprising a compound of a formula:

$$(AA^*)_{n+1}BnO_{3n+1}:D,$$

wherein A or A* is any one of an alkaline earth metal element, an alkali metal element, a lanthanum group element, and a post-transition metal element; B is a transition metal element; O is an oxygen element; D is a dopant; and n is an integer.

7. A piezoelectric-light-emission sensor using the piezoelectric structure of claim 1.

8. A display device using the piezoelectric structure of claim 1.

9. A method for manufacturing the piezoelectric structure of claim 1 comprising, a step for forming a perovskite structure layer comprising a material having an $ABO_3$ perovskite structure; and a step for forming an interlayer comprising a metal oxide (A*O) on the perovskite structure layer, wherein the step for forming the perovskite structure layer and the step for forming the interlayer are repeatedly performed, so that the interlayer may be inserted between the perovskite structure layers, and wherein A and A* are any one of an alkaline earth metal element, an alkaline metal element, a lanthanum group element, and a post-transition metal element, B is a transition metal element, and O is an oxygen element, wherein the interlayer is configured to generate lattice defects by inducing a local strain in the piezoelectric structure, and the interlayer is configured to increase a local piezo-potential of the piezoelectric structure.

10. The method for manufacturing a piezoelectric structure of claim 9, wherein the step for forming the perovskite structure layer, and the step for forming the interlayer are performed by a Physical vapor deposition (PVD), a chemical vapor deposition (CVD), or an atomic layer deposition (ALD).

11. The method for manufacturing a piezoelectric structure of claim 9, further comprising a step for forming a dopant in the perovskite structure layer or the interlayer.

* * * * *